United States Patent
Duperray

(10) Patent No.: US 7,593,699 B2
(45) Date of Patent: Sep. 22, 2009

(54) DISTORTION/EFFICIENCY ADAPTATION IN A VARIABLE-DATA-RATE RADIO TRANSMITTER

(75) Inventor: David B. Duperray, Mountain View, CA (US)

(73) Assignee: NXP B.V., Eindhoven (NL)

( * ) Notice: Subject to any disclaimer, the term of this patent is extended or adjusted under 35 U.S.C. 154(b) by 491 days.

(21) Appl. No.: 10/562,133

(22) PCT Filed: Jun. 25, 2004

(86) PCT No.: PCT/US2004/020575

§ 371 (c)(1),
(2), (4) Date: Dec. 23, 2005

(87) PCT Pub. No.: WO2005/004325

PCT Pub. Date: Jan. 13, 2005

(65) Prior Publication Data

US 2007/0109046 A1 May 17, 2007

Related U.S. Application Data

(60) Provisional application No. 60/482,584, filed on Jun. 25, 2003.

(51) Int. Cl.
*H04B 1/04* (2006.01)
*H04K 1/02* (2006.01)
(52) U.S. Cl. ............... 455/114.2; 455/115.1; 455/127.1; 455/126; 375/296
(58) Field of Classification Search .............. 455/114.3, 455/127.1, 127.2
See application file for complete search history.

(56) References Cited

U.S. PATENT DOCUMENTS

| 5,574,990 | A | * | 11/1996 | Flanagan | 455/114.3 |
| 5,625,322 | A | | 4/1997 | Gourgue et al. | |
| 6,130,916 | A | * | 10/2000 | Thomson | 375/296 |
| 6,298,221 | B1 | | 10/2001 | Nguyen | |
| 6,535,066 | B1 | * | 3/2003 | Petsko | 330/285 |
| 6,735,420 | B2 | * | 5/2004 | Baldwin | 455/127.2 |
| 6,898,415 | B2 | * | 5/2005 | Berliner et al. | 455/114.2 |
| 6,928,272 | B2 | * | 8/2005 | Doi | 455/126 |
| 7,116,951 | B2 | * | 10/2006 | Nagode et al. | 455/126 |
| 7,499,486 | B2 | * | 3/2009 | Boer et al. | 375/296 |
| 2004/0152429 | A1 | * | 8/2004 | Haub et al. | 455/102 |
| 2006/0240786 | A1 | * | 10/2006 | Liu | 455/114.3 |

* cited by examiner

*Primary Examiner*—Lana N Le

(57) ABSTRACT

The present invention generally speaking, provides for adaptive control of an RF power amplifier in view of a desired data rate. For low data rates, the RF amplifier (121) is controlled so as to allow significant output signal distortion, at the same time operating within a region of increased efficiency of the RF power amplifier. For higher data rates, the RF amplifier (121) is controlled so as to reduce the output signal distortion. During such times, lower efficiency of the RF power amplifier is attained. Efficiency of the RF power amplifier (121) is thus maximized in view of data rate requirements. In the case of battery-powered radio transmitter, increased efficiency results in longer battery life. In a specific embodiment, an on-the-fly calibration is performed in which output signal distortion is measured. A precalculated table stores information relating output signal distortion to expected Error Vector Magnitude (EVM) at the radio receiver.

12 Claims, 4 Drawing Sheets

DISTORTION/EFFICIENCY ADAPTATION IN A VARIABLE-DATA-RATE RADIO TRANSMITTER

CROSS REFERENCE TO RELATED APPLICATION

This application claims the benefit of U.S. provisional application Ser. No. 60/482,584 filed 25 Jun. 2003, which is incorporated herein whole by reference.

The present invention relates to Radio Frequency (RF) transmitters and particularly to distortion/efficiency adaptation in a radio transmitter.

Referring to FIG. 1, a simplified block diagram is shown of a typical 802.11a transceiver, including a baseband portion 110 and a radio portion 120. The radio portion includes an RF transmit path 121 and an RF receive path 123, both coupled to a shared antenna 125 through an RF switch 127. The RF transmit path 121 has applied to it from the baseband portion 110 an RF transmit signal 101, and the RF receive path applies to the baseband portion an RF receive signal 103. Both the RF transmit signal 101 and the RF receive signal 103 are time-domain signals.

The baseband portion 110 includes a baseband processor 111 that operates in the frequency domain. Hence, IFFT and FFT blocks (113, 115) are provided. The IFFT block 113 transforms frequency-domain signals from the baseband processor into time-domain RF transmit signals, and the FFT block 115 transforms time-domain RF receive signals from the radio portion into baseband frequency-domain signals.

An 802.11a system is an example of an OFDM system in which information is transmitted on multiple (typically numerous) subcarriers. The subcarrier structure for 802.11a is shown in FIG. 2. The subcarriers occur as pairs of positive and negative frequency subcarriers. In 802.11a, there are 26 such pairs for a total of 52 subcarriers. Two subcarrier pairs, or four subcarriers, are used for pilot signals, leaving 48 data subcarriers. These data subcarriers are numbered 0 through 47, left (negative frequency) to right (positive frequency).

Ideally, a radio transmitter should achieve low output signal distortion. In an OFDM system such as 802.11a, however, due to the non-linearity of the amplifier stages, intermodulation products are created by the multiple tones. The intermodulation products become interferer tones for the information tones, degrading the overall signal quality of the OFDM signal. One measure of output signal distortion is the third-order output intercept point (OIP3). Another (related) measure of output signal distortion is the third-order output intermodulation product level (OIM3). The relevant measure for signal quality is error vector magnitude (EVM).

Techniques for varying OIP3 in an RF power amplifier receive chain are known. One such technique is described, for example, in U.S. Pat. No. 6,298,221, incorporated herein by reference.

To achieve low distortion, the RF amplifier of the radio transmitter must be operated in a linear range. Amplifier efficiency, however, is greatest when the amplifier is operated at or near saturation. Presently, production-line calibration of radio equipment is commonly performed in which output signal power is measured as a function of control parameters and environmental conditions. A lookup table is used to store calibration information such that, during operation, when a particular output power is desired, the correct control parameters can be applied to the power amplifier to achieve the desired output power with a desired accuracy. Such production-line calibration is expensive and time-consuming.

Furthermore, in the case of a variable-data-rate radio transmitter, such as the 802.11a radio transmitter of FIG. 1, such calibration typically does not take into account a desired data rate. An 802.11a transmit chip supports different data rates having different EVM requirements. A typical transmit chip is designed to meet the most stringent EVM requirement (e.g., −25 dB). That is, the typical 802.11a transmitter is very linear (implying very high OIP3) to limit the intermodulation products and meet the more stringent EVM limit. A highly linear transmitter, however, exhibits high current comsumption, which is undesirable for mobile applications.

It is desirable, therefore, in determining how a power amplifier is to be controlled, to take into account a desired data rate at the time control is to be applied.

The present invention, generally speaking, provides for adaptive control of an RF power amplifier in view of a desired data rate. For low data rates, the RF amplifier is controlled so as to allow significant output signal distortion, at the same time operating within a region of increased efficiency of the RF power amplifier. For higher data rates, the RF amplifier is controlled so as to reduce the output signal distortion. During such times, lower efficiency of the RF power amplifier is attained. Efficiency of the RF power amplifier is thus maximized in view of data rate requirements. In the case of battery-powered radio transmitters, increased efficiency results in longer battery life. In a specific embodiment, an on-the-fly calibration is performed in which output signal distortion is measured. A precalculated table stores information relating output signal distortion to expected Error Vector Magnitude (EVM) at the radio receiver. EVM requirements are more stringent at higher data rates and less stringent at lower data rates. If the output signal distortion is within an desirable ranges for purposes of a desired data rate, the operating conditions of the RF amplifier are not changed. If the output signal distortion is too great, operating conditions of the RF amplifier are changed to reduce distortion, sacrificing efficiency. If output signal distortion is quite low compared to the allowable distortion for a particular data rate, operating conditions of the RF amplifier are changed to increase distortion, thereby achieving higher efficiency.

The present invention may be more fully understood from the following description in conjunction with the appending drawing figures. In the drawing.

In order to optimize the efficiency of an OFDM transmitter such as an 802.11a transmitter, the IFFT and the FFT processing capabilities of the baseband are used to accurately measure and tune the OIP3 of the amplification path. The linearity of the amplification path (and hence its current consumption) is adjusted and controlled. The transmit path efficiency is dynamically optimized based on the transmit data rate and the corresponding required signal quality (EVM). As a result, the overall transmitter is more efficient and hence better suited for mobile applications.

Figure 1:
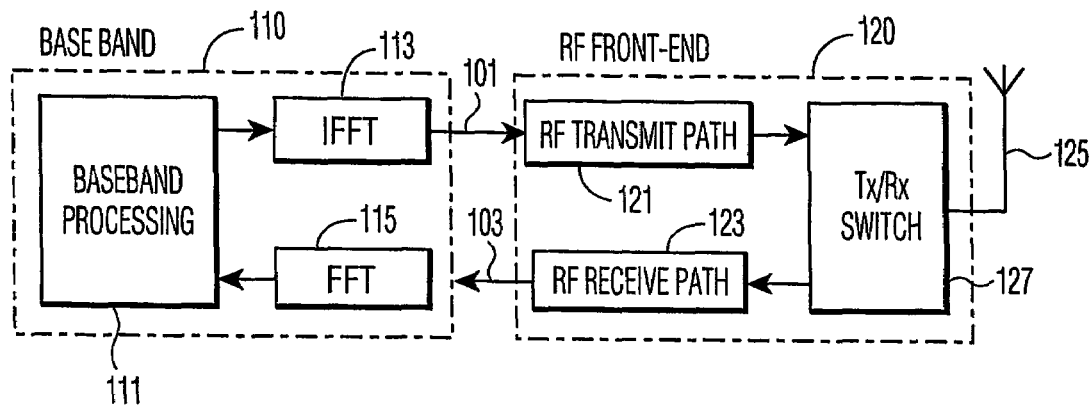
FIG. 1 is a simplified block diagram showing a known radio transceiver.
Figure 2:
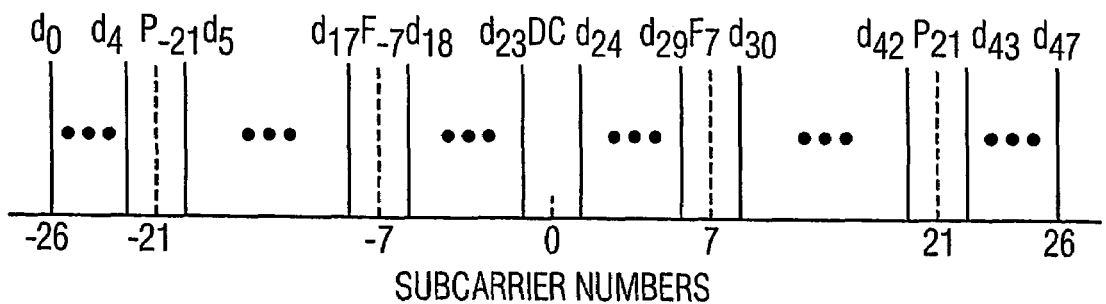
FIG. 2 is diagram showing subcarriers used in the radio transceiver of FIG. 1.
Figure 3:
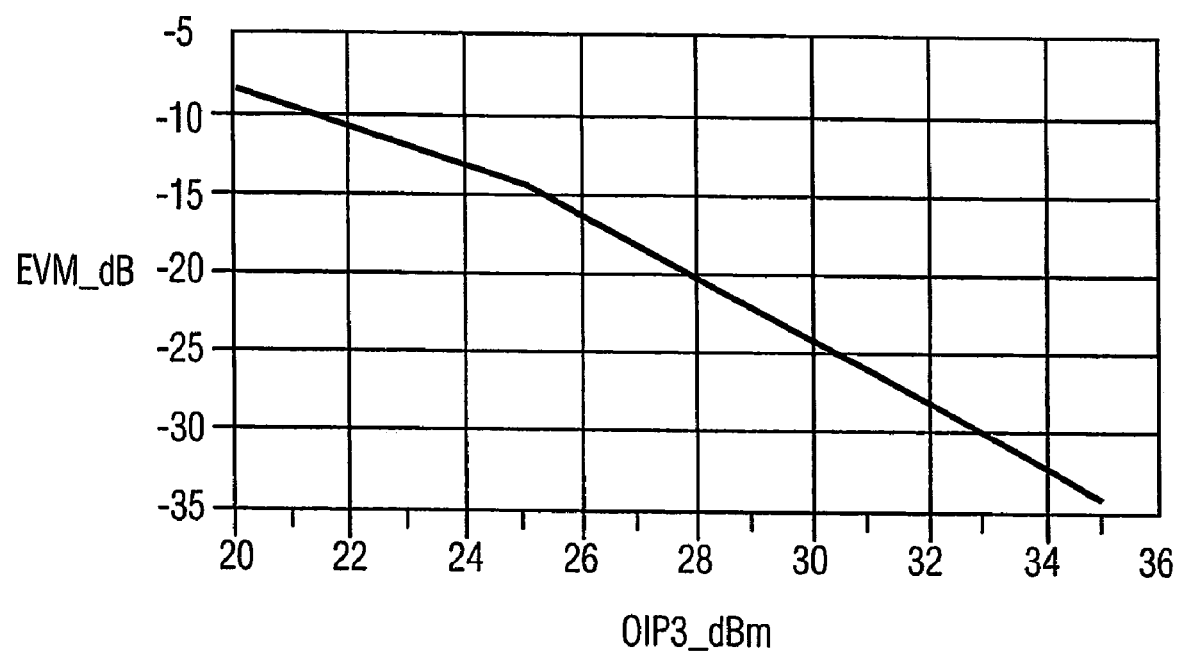
FIG. 3 is a graph showing EVM as a function of third-order output intercept point (OIP3)

Referring now to FIG. 3, a graph is shown relating EVM (dB) to OIP3 (dB) for a particular 802.11a transmitter design. In one aspect, the graph simply illustrates that low EVM, corresponding to high signal quality, requires high OIP3, corresponding to very linear amplifier chain operation. High EVM, corresponding to low signal quality, requires only low OIP3, corresponding to less linear amplifier chain operation.

In another aspect, the graph of FIG. 3 may be viewed as the basis for a control mechanism. That is, for a given EVM requirement, the corresponding OIP3 needed to meet that EVM requirement may be determined. Once the EVM requirement has been determined, a control mechanism may then be used to set the OIP3 of the transmit amplifier chain to the proper level. This process is referred to herein as a transmit self-calibrating mode. Information of the type illustrated in FIG. 3 may be stored in a lookup table (not shown) for use in selfcalibrating mode.

Figure 4:
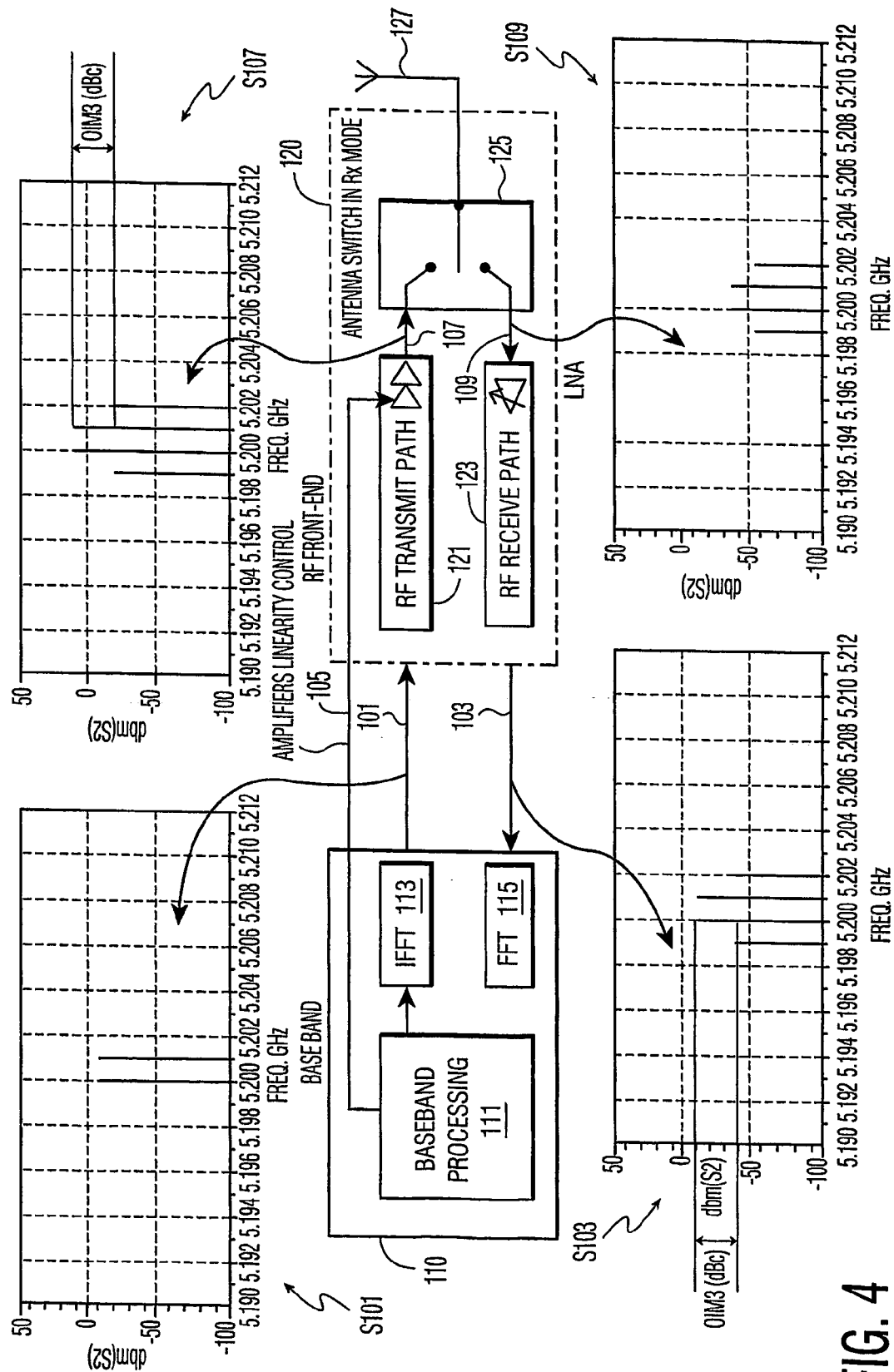
FIG. 4 is a diagram showing signal flow through the transmit and receive chains during self-calibration mode.

In the case of an 802.11a transceiver, the IFFT and FFT capabilities of the transmitter may be used to advantage to realize a transmit self-calibrating mode. Referring to FIG. 4, an exemplary embodiment of the transmit self-calibrating mode is illustrated. Note in FIG. 4 an amplifier linearity control path 105 between the baseband processor 111 and the RF transmit path 121. In the exemplary embodiment, the transmitter transmits just two subcarriers (subcarriers +1 and −1, for example). An illustration of the two subcarriers is shown at S101. Going through the amplification stages, IM3 products will be created. An illustration of the subcarriers together with the IM3 products is shown at S107. The difference in signal level between the transmitted tones and the IM3 products (in dBc) is defined as OIM3. To accurately measure the IM3 level in dBc, the receive chain is activated when the transmit chain is transmitting the two tones. The Tx/Rx switch is switched to idle mode. The Rx/Tx switch isolation attenuates the transmitted two tones by, say, 30 dB, which is important in order to avoid compression of the RF stages on the receive chain. An illustration of the signal components at the input to the RF receive path is shown at S109. If necessary, the front-end low-noise amplifier (LNA) of the receive RF chain can be switched off, adding a comparable amount of additional isolation between the transmitter chain and the receiver chain back-end components. An illustration of the signal components at the output of the RF receive path is shown at S103. The output signal of the RF receive path, which includes these signal components, is input to the FFT block.

The FFT block determines the distribution of signal energy within the receive spectrum, and in particular the signal level of the main transmit tones and the signal level of the IM3 interferers. Thus, following the FFT, the baseband processor can estimate the level of the transmit OM3 in dBc.

It is convenient for purposes of amplifier control to use OIP3 values rather than OIM3. The OIM3 value obtained is therefore converted into a corresponding OIP3 value using a well-known mathematical relation. Then, a lookup table (LUT) that stores the EVM versus OIP3 characteristic of the transmitter, such as that illustrated in FIG. 3, is used to control the transmit amplifier linearity to increase or decrease the OIP3 based on the current targeted data rate and hence the targeted EVM. Techniques similar to those described in the aforementioned U.S. Pat. No. 6,298,221 may be used for this purpose. In other embodiments, an EVM vs. OIM3 LUT may be used.

Control of the transmit amplifier OIP3 may be open-loop or closed-loop (iterative). In an exemplary embodiment, iterative control is used. After modifying the amplifier's linearity, self-calibration is repeated, and OIP3 is once again measured. If the OIP3 does not meet the required level for the targeted EVM, the amplifierz's linearity is adjusted again.

Figure 5:
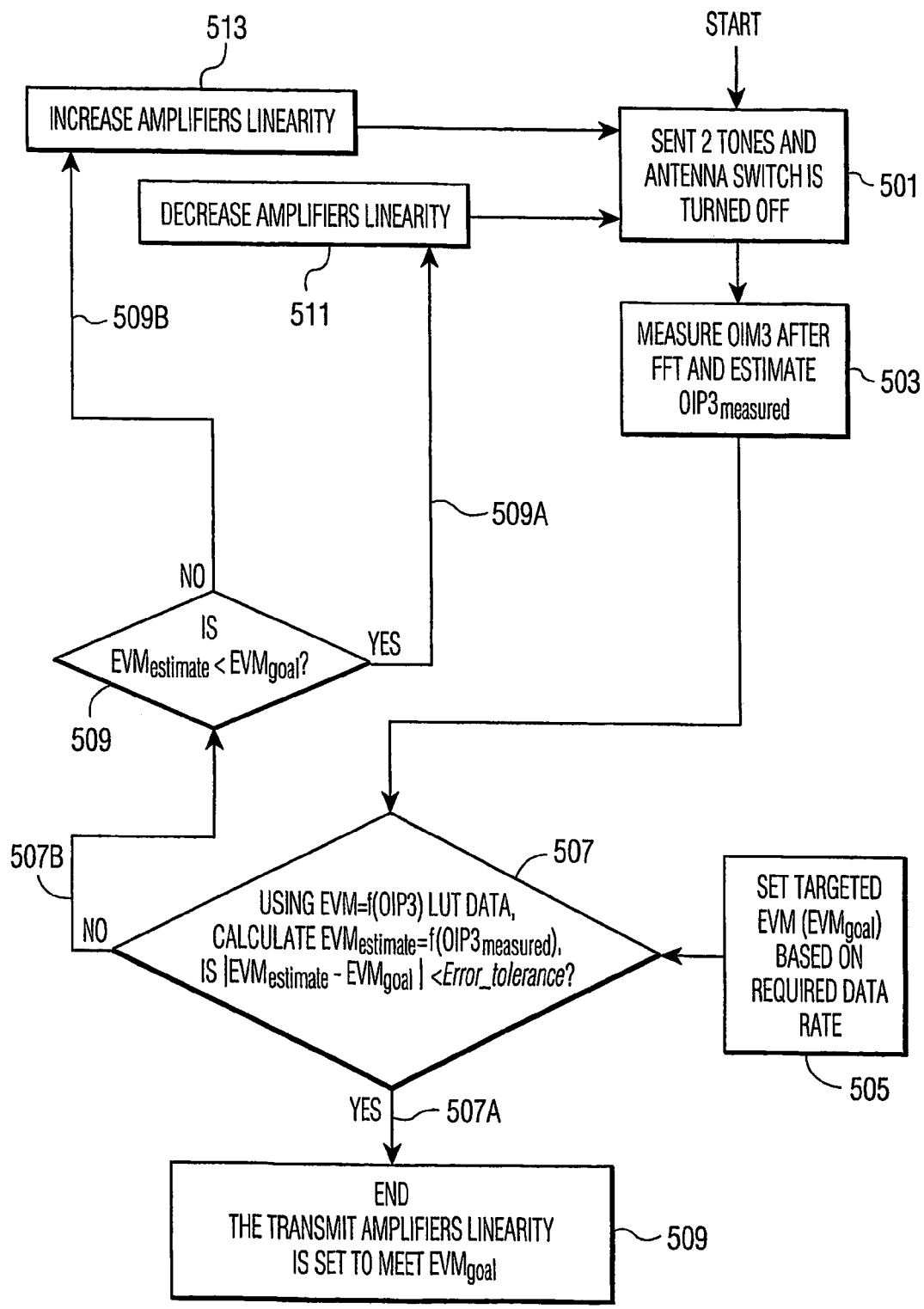
FIG. 5 is a flowchart illustrating the operation of self-calibration mode.

Referring to FIG. 5, a flowchart is shown of a self-calibration routine in accordance with an exemplary embodiment of the invention. The flowchart may be implemented in software or in hardware, such as in a state machine.

At the beginning of the self-calibration routine (501), two tones are sent, and the antenna switch is turned off. As a result, there is input to the receive chain a leakage signal from the transmit chain which includes both the two tones and its intermodulation products. The baseband processor uses results of the FFT block to measure OIM3, and to in turn estimate OIP3 (503).

Meanwhile, a targeted EVM has been set based on a required data rate (505). From the LUT, an estimate of EVM is obtain as a function of OIP3. If the estimated EVM is within a certain error tolerance of the targeted EVM (507a), then the transmit amplifier's linearity is set to meet the targeted EVM (509), and self-calibration concludes. If not, then amplifier linearity needs to be increased (to meet EVM requirements) or decreased (to conserve power while still meeting EVM requirements).

Therefore, if estimated EVM is less (better) than the targeted EVM (by more than the specified tolerance) (509a), the amplifier's linearity is decreased (511). Conversely, if estimated EVM is greater (worse) than the targeted EVM (by more than the specified tolerance) (509b), the amplifier's linearity is increased (513).

Self-calibration then continues by performing the identical sequence of operations again, until the transmit amplifier's linearity has been set to meet the targeted EVM to within the specified error tolerance.

The foregoing procedure based on the transmission and reception of two tones is simple to implement for OFDM based systems (using FFT and IFFT blocks). Self calibration performed in this manner is very fast and does not require any extra data processing (such as decoding a complete training sequence).

It will be appreciated by those of ordinary skill in the art that the present invention can be embodied in other specific forms without departing from the spirit or essential character thereof. The disclosed embodiments are intended in all respects to be illustrative and not restrictive. The invention is defined by the appended claims rather the foregoing description, and all changes which come within the range of equivalents thereof are intended to be embraced therein.

What is claimed is:

1. A communications method comprising:
   obtaining unwanted intermodulation distortion products from an amplifier;
   measuring the intermodulation distortion products to obtain intermodulation distortion product measurements;
   determining whether amplifier linearity is within an acceptable range based on the intermodulation distortion product measurement and a desired data rates; and
   controlling the amplifier to reduce output signal distortion for data rates higher than the desired data rate but not for data rates below the desired data rate.

2. The method of claim 1, further comprising:
   adjusting amplifier linearity to fall within said acceptable range.

3. The method of claim 2,
   wherein adjusting amplifier linearity further comprises:
   determining an acceptable error vector magnitude for the desired data rate;
   determining a corresponding desired third-order output intercept point value; and
   adjusting at least one amplifier control signal in response to the desired third-order output intercept point value.

4. The method of claim 1, further comprising:
receiving the intermodulation distortion products through a leakage path.

5. The method of claim 4,
wherein measuring the intermodulation distortion products further comprises:
transforming a received signal from the time domain to the frequency domain.

6. The method of claim 1, further comprising:
using an IFFT operation to obtain the unwanted intermodulation distortion products.

7. A communications apparatus comprising:
an amplifier that produces unwanted intermodulation distortion products;
means for measuring the intermodulation distortion products to obtain an intermodulation distortion product measurement;
means for determining whether amplifier linearity is within an acceptable range based on the intermodulation distortion product measurement and a desired data rate; and
means for controlling the amplifier to reduce output signal distortion for data rates higher than the desired data rate but not for data rates below the desired data rate.

8. The apparatus of claim 7, further comprising:
means for adjusting amplifier linearity to fall within said acceptable range.

9. The apparatus of claim 8,
wherein said means for adjusting amplifier linearity further comprises:
means for determining an acceptable error vector magnitude for the desired data rate;
means for determining a corresponding desired third-order output intercept point value; and
means for adjusting at least one amplifier control signal in response to the desired third-order output intercept point value.

10. The apparatus of claim 7, further comprising;
a leakage path through which the intermodulation distortion products are received.

11. The apparatus of claim 10,
wherein said means for measuring the intermodulation distortion products further comprises an FFT block.

12. The apparatus of claim 7, further comprising:
an IFFT block that obtains the unwanted intermodulation distortion products.

* * * * *